United States Patent [19]

Ishioka et al.

[11] Patent Number: 4,626,885
[45] Date of Patent: Dec. 2, 1986

[54] PHOTOSENSOR HAVING IMPURITY CONCENTRATION GRADIENT

[75] Inventors: Sachio Ishioka, Tokyo; Yoshinori Imamura, Hachioji; Tsuyoshi Uda, Kodaira; Yukio Takasaki, Hachioji; Chushirou Kusano, Tokorozawa; Hirofumi Ogawa; Tatsuo Makishima, both of Hachioji; Tadaaki Hirai, Koganei, all of Japan

[73] Assignee: Hitachi, Ltd., Tokyo, Japan

[21] Appl. No.: 518,658

[22] Filed: Jul. 29, 1983

[30] Foreign Application Priority Data

Aug. 23, 1982 [JP] Japan .................. 57-144647

[51] Int. Cl.$^4$ .................. H01J 31/00; H01L 27/14; H01L 31/00
[52] U.S. Cl. .................................. 357/31; 357/2; 357/30; 357/90; 313/366; 313/386
[58] Field of Search ............... 313/365, 366, 385, 386, 313/392; 357/31, 90, 2, 30; 204/192 P

[56] References Cited

U.S. PATENT DOCUMENTS

| | | | |
|---|---|---|---|
| 4,086,102 | 4/1978 | King | 357/90 |
| 4,254,359 | 3/1981 | Derks et al. | 313/386 |
| 4,265,991 | 5/1981 | Hirai et al. | 204/192 P |
| 4,330,733 | 5/1982 | Shidara et al. | 313/386 |
| 4,348,610 | 9/1982 | Dieleman et al. | 313/386 |
| 4,378,417 | 3/1983 | Maruyama et al. | 204/192 P |
| 4,517,269 | 5/1985 | Shimizu et al. | 313/386 |
| 4,536,459 | 8/1985 | Misumi et al. | 357/2 |
| 4,564,784 | 1/1986 | Ishioka et al. | 313/386 |

FOREIGN PATENT DOCUMENTS

| | | | |
|---|---|---|---|
| 0039219 | 11/1981 | European Pat. Off. | 313/385 |
| 0094076 | 11/1983 | European Pat. Off. | 313/386 |

OTHER PUBLICATIONS

Thompson et al., *R. F. Sputtered Amorphous Silicon Solar Cells*, Proc. Int'l. Photovoltaic Solar Energy Conference, (9/1977), Reide Publ. (1978).
Paul et al., *Doping, Schottky Barrier and p-n Junction Formation in a-Ge and -Si by rf Sputtering*, Solid State Communications, vol. 20, No. 10, (Dec. 1976) p. 969.
Thompson et al., *Co-Sputtered Doped a-Si as a Photovoltaic Material*, Conf. Rec., 14th IEEE PVSp. Conf., (1980).

*Primary Examiner*—James W. Davie
*Assistant Examiner*—Vangelis Economou
*Attorney, Agent, or Firm*—Antonelli, Terry & Wands

[57] ABSTRACT

A photosensor including a transparent electrode for transmitting incident light and a photoconductive layer receiving light from the transparent electrode for performing photoelectric conversion, is disclosed in which the photoconductive layer is made of amorphous silicon, the amorphous silicon contains 5 to 30 atomic percent hydrogen and is doped with at least one selected from elements belonging to the groups II and III in such a manner that a region remote from the transparent electrode is higher in the concentration of the selected element than another region proximate to the transparent electrode, and a voltage is applied across the photoconductive layer so that a surface of the photoconductive layer facing the transparent electrode is at a positive potential with respect to another surface of the photoconductive layer opposite to the surface facing the transparent electrode.

15 Claims, 10 Drawing Figures

PHOTOSENSOR HAVING IMPURITY CONCENTRATION GRADIENT

BACKGROUND OF THE INVENTION

The present invention relates to a photosensor used in a storage mode, and more particularly to a photosensor which is used in a photoconductive imaging tube or solid-state imaging device and has a photoconductive layer made of hydrogen-containing amorphous silicon.

The hydrogen-containing amorphous silicon is photoconductive, and moreover a large-area, thin and uniform film thereof can be formed at lower deposition temperatures as compared with such a thin film of monocrystalline silicon. Therefore, it has been proposed to make the photosensing area of a solar cell, imaging device or the like of the hydrogen-containing amorphous silicon. A photoconductive imaging tube shown in FIG. 1 is a typical example of photosensors used in a storage mode, and includes a transparent substrate 1 (usually called a face plate), a transparent conductive layer 2 or a transparent electrode, a photoconductive layer 3, an electron gun 4, and an envelope 5 (for example, a glass tube). Light having passed through the face plate 1 is focussed on the photoconductive layer 3 to form a light signal, which produces photo carriers in the photoconductive layer 3. The photo carriers thus produced are stored in a surface of the layer 3 in the form of a charge pattern, and are successively read out. In general, a beam landing layer 7 is provided on another surface of the photoconductive layer 3, to prevent the secondary electron emission from the layer 3 and to prevent an electron from being injected from a scanning electron beam into the photoconductive layer 3.

The present inventors have proposed to make the above-mentioned photoconductive layer of a hydrogen-containing amorphous material whose main constituent element is silicon. This proposal is described in U.S. Pat. No. 4,255,686 and U.S. patent application Ser. No. 257,611 now U.S. Pat. No. 4,419,604.

An image pickup tube having a photoconductive layer of amorphous silicon is high in photoelectric conversion efficiency, and is excellent in resolution and heat resistance. In a conventional image pickup tube of this kind, the photoconductive layer 3 is formed of an amorphous silicon film having a high electric resistance, that is, a resistivity of not less than $10^8$ $\psi$cm. In more detail, the electric resistance of the film is made high to cause the image pickup tube to perform a storage type operation, and to increase the resolution of the tube. The high-resistance film has hitherto been formed in two manners. That is, a film showing a special infrared absorption peak is formed by a reactive sputtering method, or a very small amount of impurities are added to a deposited amorphous silicon layer by a glow discharge method, as described in a Japanese Patent Application Laid-open No. 153782/81. In the case where the glow discharge method is used, an amorphous silicon layer which is doped with arsenic, phosphorus or the like at a concentration of about 200 ppm to have a resistivity of not more than $10^6$ $\psi$cm, can be interposed, as a blocking layer, between a transparent electrode and a high-resistance amorphous silicon layer having a resistivity of not less than $10^8$ $\psi$cm and serving as a photoconductive layer, to improve the characteristics of an image pickup tube. In either method, however, the whole of a photoconductive layer which is a main part of a photoelectric conversion section, is formed of a single film having a uniform composition. Accordingly, it has been observed that the sensitivity and lag characteristics of an image pickup tube vary with the frequency of signal light.

In more detail, in the case where a picture image is formed of blue light, a voltage necessary to sufficiently take out a signal from the photoconductive layer is higher, as compared with the case where the picture image is formed of red light. And further, the decay of afterimage depends upon the frequency of signal light. These are very serious problems when an amorphous silicon layer is used in an image pickup tube for color TV.

SUMMARY OF THE INVENTION

An object of the present invention is to provide a photosensor having a photoconductive amorphous silicon layer which can solve the above-mentioned problems and can produce at all wavelengths of signal light a picture image signal excellent in sensitivity, lag characteristics and others.

In order to attain the above object, in a photosensor according to the present invention, a photoconductive layer is formed of an amorphous silicon film which contains at least 5 to 30 atomic percent hydrogen and is doped with a very small amount of impurity in such a manner that a concentration gradient of impurity is formed in the direction of thickness of the film, the impurity is at least one selected from elements belonging to the group III such as boron, aluminum, gallium and indium and from elements belonging to the group II such as zinc and cadmium, and a voltage is applied across the photoconductive layer so that a surface of the photoconductive layer facing a transparent electrode is at a positive potentional with respect to another surface of the photoconductive layer opposite to the surface facing the transparent electrode. According to one aspect of the present invention, the distribution of impurity concentration in the photoconductive layer is as follows. That is, the impurity concentration is not more than 5 ppm at the interface between the photoconductive layer and a transparent conductive layer, is equal to zero or increases with the distance from the above-mentioned interface in a region of the photoconductive layer between the interface and a middle portion of the photoconductive layer, and lies in a range from 1 to 100 ppm (preferably, a range from 5 to 100 ppm) at a farther surface of the photoconductive layer from the above interface. And further, it is preferred to make the impurity concentration in the photoconductive layer not more than 10 ppm within a 0.5 $\mu$m region from the interface. According to another aspect of the present invention, at least one of a thin semiconductor layer of n-type conductivity and a thin transparent dielectric layer is interposed between the photoconductive layer and transparent conductive layer. According to a further aspect of the present invention, a beam landing layer is provided on a surface of the photoconductive layer apart from the transparent conductive layer, and the intensity distribution of incident light at the transparent conductive layer is detected by scanning the beam landing layer with an electron beam.

DESCRIPTION OF THE PREFERRED EMBODIMENTS

Figure 1:
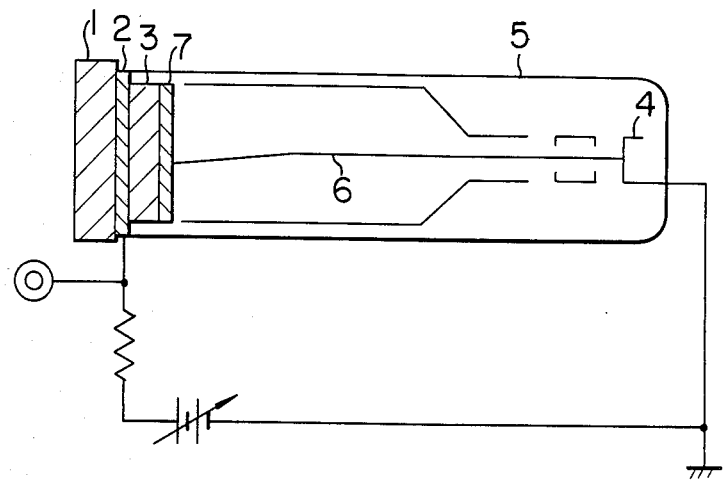
FIG. 1 is a sectional view showing a photoconductive imaging tube.
Figure 2:
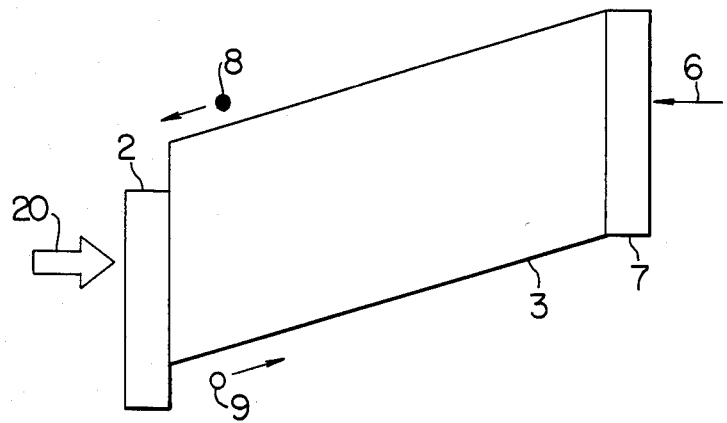
FIG. 2 is a schematic view showing the energy band structure of a photoconductive layer which is being operated.

First, the mechanism of photoelectric conversion performed in amorphous silicon will be explained for the case where the amorphous silicon is used as a photoconductive layer of an image pickup tube, by way of example. FIG. 2 shows the energy band structure of a photoconductive layer which is made of amorphous silicon and is now being operated. In FIG. 2, the same reference numerals as in FIG. 1 designate like parts and members, and an arrow 20 indicates incident signal light. In the image pickup tube, a voltage is applied across an amorphous photoconductive layer 3 so that positive holes (namely, holes) flow through the layer 3 on the electron-beam receiving side. Incidentally, reference numeral 6 designates a scanning electron beam. The incident signal light passes through a transparent electrode 2, and is then absorbed by the amorphous photoconductive layer 3, to generate electron 8 and hole 9.

The incident signal light having an intensity $I_o$ is absorbed in accordance with the absorption coefficient $\alpha$ of amorphous silicon, and the intensity I of signal light at a position apart from the transparent electrode 2 a distance x is given by the following equation:

$$I = I_o e^{-\alpha x} \quad (1)$$

In fact, an amorphous silicon layer used in an imaging device is required to have a forbidden band gap of 1.8 to 2.0 eV, which is larger as compared with the forbidden band gap of an amorphous silicon layer used as a solar cell, that is, about 1.6 eV. In this case, the greater part of signal light, for example, the greater part of blue light having a wavelength of 450 nm is absorbed, on the basis of the equation (1), by a region of the amorphous silicon layer defined by the transparent electrode and a distance of about 0.5 μm from the transparent electrode. Accordingly, as shown in FIG. 2, an electron-hole pair is generated in the vicinity of the transparent electrode 2, and therefore the hole travels a pretty long distance in the amorphous silicon layer.

In a conventional photoconductive layer made of amorphous silicon of high resistance, the relation between material properties and the mobility of each of electron and hole is not taken into consideration, and moreover the dependence of electrical output on the wavelength of incident light is not considered. Accordingly, in a color imaging device in which signals corresponding to different wavelength components of incident light are simultaneously processed, there arise the previously-mentioned problems.

The present invention is based upon the following knowledge which has been obtained from the present inventors' investigation of the mobility of electron and hole in an amorphous silicon photoconductor.

Figure 3:
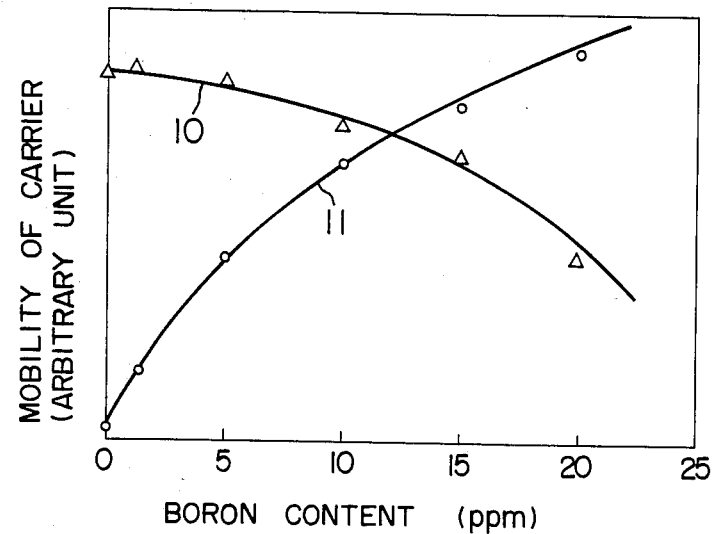
FIG. 3 is a graph showing a relation between boron content and each of electron mobility and hole mobility.

FIG. 3 shows a relation between doping level and the mobility of each of electron and hole in the case where amorphous silicon doped with a group-III element is deposited by the reactive sputtering method. In FIG. 3, a curve 10 indicates the mobility of electron, and a curve 11 the mobility of hole. The amorphous silicon doped with the group-III element can be obtained by adding a gas containing the group-III element to a reaction gas necessary for sputtering reaction, or by using, as a silicon source, silicon which contains the group-III element.

The present inventors have formed several amorphous silicon films doped with boron which are different in boron content from each other, in such a manner that different amounts of diborane $B_2H_6$ are added to the reaction gas, and have investigated how the photocurrent caused by each of electron and hole in the amorphous silicon films varies with the boron content. FIG. 3 shows the results of this investigation. As is apparent from FIG. 3, the mobility of electron decreases as the boron content is larger, while the mobility of hole increases greatly as the boron content is larger.

As mentioned previously, carriers are created in the photoconductive layer at a position near the transparent electrode 2, by incident light. The electrons thus created travel toward the transparent electrode 2, and the holes travel toward the electronbeam receiving side of the photoconductive layer.

The concentration of each of photoexcited electron and hole, the electron current density, and the hole current density are given by the following equations:

$$j_p = e\mu_p E - eD_p \frac{\partial p}{\partial x} \quad (2)$$

$$j_e = e\mu_e E + eD_e \frac{\partial n}{\partial x} \quad (3)$$

$$\frac{1}{e} \frac{\partial j_p}{\partial x} = -\frac{1}{e} \frac{\partial j_e}{\partial x} = I_o e^{-\alpha x} \quad (4)$$

where p indicates a hole concentration, n an electron concentration, $j_p$ a hole current density, $j_e$ an electron current density, $\mu_e$ an electron mobility, $D_e$ an electron diffusion coefficient, $\mu_p$ a hole mobility, and $D_p$ a hole diffusion coefficient.

In the above equations (2), (3) and (4), the electron-hole recombination process and the internal space charge effect are neglected. Accordingly, these equations are not satisfactory when the absolute value of sensitivity of image pickup tube is discussed, but are sufficient approximation for studying the absorption coefficient $\alpha$ of a photoconductive layer and the dependence of a ratio $j_p/j_e$ on the position in the direction of thickness of the photoconductive layer. From the equations (2), (3) and (4), we obtain the following equations:

$$j_p = \frac{eI_oE}{eE/kT + a} \left[ \frac{eE}{kT} - \left( \frac{eE}{kT} + a \right) e^{-ax} \right] \quad (5)$$

$$j_e = eEI_o e^{-ax} \quad (6)$$

Figure 4:
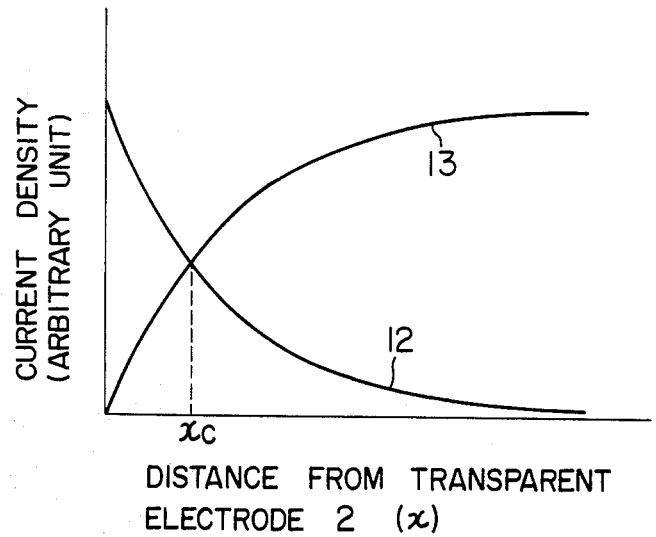
FIG. 4 is a graph showing the distribution of each of electron current density and hole current density in a photoconductive layer.

FIG. 4 shows the dependence of each of the hole current density $j_p$ and electron current density $j_e$ on the position in the direction of thickness of the photoconductive layer. In FIG. 4, a curve 12 indicates the variation of the electron current density $j_e$ with the distance x from the transparent electrode 2, and a curve 13 the variation of the hole current density $j_p$ with the distance x. When a distance between the transparent electrode 2 and a position in the photoconductive layer at which the hole current density $j_p$ is equal to the electron current density $j_e$, is expressed by $x_c$, the electron current density $j_e$ is larger than the hole current density $j_p$ in a region of the photoconductive layer satisfying a relation $x < x_c$, and the hole current density $j_p$ is larger than the electron current density $j_e$ in another region satisfying a relation $x > x_c$. From the equations (5) and (6), we obtain the distance $x_c$ as follows:

$$x_c = \frac{1}{a} \ln 2 \left( 1 + \frac{kTa}{eE} \right) \quad (7)$$

As has been explained in detail, the hole mobility in amorphous silicon is increased by doping the amorphous silicon with a group-III element. Accordingly, it is required that at least the region of the photoconductive layer satisfying the relation $x > x_c$ is doped with a group-III element. While, the electron mobility in amorphous silicon is decreased by the addition of a group-III element, and therefore the concentration of a group-III element in the region satisfying the relation $x < x_c$ is made equal to zero or very low (for example, the doping level at the interface between the transparent electrode and photoconductive layer is made not more than 5 ppm). In a photoconductive layer according to the present invention, a concentration gradient of a group-III element is formed in the direction of thickness of the photoconductive layer. Such a characteristic composition according to the present invention is based upon the above-mentioned inventors' investigation.

Even when an amorphous silicon layer is formed under well-controlled fabricating conditions, the mobility of each of electron and hole usually varies in some degree. However, the distance $x_c$ used by the present inventors, as is evident from the calculation process thereof, is independent of the mobility of each of electron and hole. Accordingly, the present inventors' knowledge as above makes it possible to design a photoconductive layer on the basis of only the absorption coefficient $a$, without taking into consideration the mobility of electron and hole.

The above-mentioned results of the investigation have been obtained on the assumption that the distance $x_c$ is far smaller than the thickness d of the photoconductive layer. In the case where the distance $x_c$ is greater than or equal to the thickness d, it is preferred that a region of the photoconductive layer satisfying a relation $x > d/2$ is doped with a group-III element.

In short, in the photoconductive layer for use in an image pickup tube, only a region between the electron-beam receiving surface and an area which is away from the light receiving surface by smaller one of the values $x_c$ and $d/2$, is doped with a group-III element. Actually, the advantages of the present invention are obtained even when a distance $x_c \pm 0.5$ μm is used in place of the distance $x_c$. However, it is preferable to use the distance $x_c$. Further, the advantages are obtained even when a group-II element such as cadmium or zinc is used as a dopant in place of a group-III element.

Now, the present invention will be explained below in detail, on the basis of embodiments thereof.

EMBODIMENT 1

A photosensing layer (namely, photoconductive layer) of amorphous silicon is formed by the use of a sputtering instrument having a plurality of material sources. A transparent electrode of tin oxide, indium oxide or the like is deposited on an optical flat glass face plate having an appropriate diameter, and the glass face plate provided with the transparent electrode is used as a substrate. One of the material sources is high-purity silicon, and the other material source is boron-containing silicon prepared so that a deposited amorphous silicon layer contains boron at a concentration of 10 ppm. The substrate is put into the sputtering instrument, and is first disposed face to face with the high-purity silicon source.

The sputtering instrument is evacuated to a pressure of not more than $1 \times 10^{-6}$ Torr, and then a mixed gas atmosphere of argon and hydrogen is introduced into the instrument so that the pressure within a belljar is put in a range from $5 \times 10^{-4}$ to $5 \times 10^3$ Torr. The mixed gas atmosphere contains 10 to 70% hydrogen, preferably 30 to 65% hydrogen. The substrate is heated to a temperature of 150° to 300° C., and RF power is supplied to the high-purity silicon source, thereby generating a plasma. Thus, amorphous silicon is deposited on the substrate. The input RF power is adjusted so that the deposition rate becomes equal to 0.3 nm/s, and the above reaction is continued for 30 minutes. Thereafter, the substrate is moved in the belljar so as to face the boron-containing silicon source, and the above reaction is continued for 190 minutes.

Figure 5:
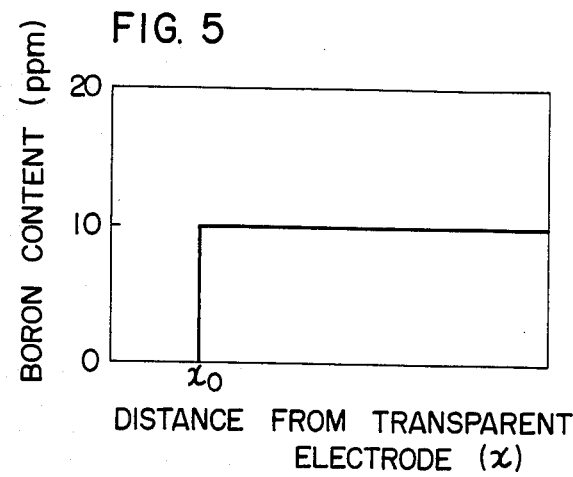
FIG. 5 is a graph showing the distribution of boron content in an embodiment of a photoconductive layer according to the present invention.

An amorphous silicon layer obtained by the above operation includes two regions, one of which has a depth of about 500 nm from the transparent electrode and is made of hydrogen-containing silicon free from impurities, and the remaining region has a thickness of 4 μm and is made of hydrogen-containing silicon doped with boron. FIG. 5 shows the distribution of boron content in this photoconductive layer. The light absorption of such a photoconductive layer depends upon discharge conditions, the distance between the substrate and each of the material sources, and the structure of the sputtering instrument. In many cases, when the amorphous silicon layer used as the photoconductive layer has a forbidden energy band of 1.8 to 2.0 eV, the absorption coefficient $a$ of the photoconductive layer is about $10^5$ cm$^{-1}$ for blue light having a wavelength of 450 nm, about $2 \times 10^4$ cm$^{-1}$ for green light having a wavelength of 550 nm, and about $10^3$ cm$^{-1}$ for red light having of a wavelength of 650 nm.

For instance, it is calculated from the equation (7) that the distance $x_c$ for signal light having a wavelength of 450 nm is equal or nearly equal to 500 nm. Actual measurements for the photoconductive layer deposited in the above-mentioned manner have shown that more than 99% of the signal light having a wavelength of 450 nm is absorbed by a region of the photoconductive layer having a depth of 500 nm from the light receiving surface thereof.

Antimony trisulfide $Sb_2S_3$ was evaporated on the photoconductive layer (namely, photosensing layer) thus deposited, to form an electron beam scanned surface. Thereafter, the substrate having the photoconductive layer and others was incorporated in an imaging tube, and the characteristics of the tube were measured. The measurements showed that, at an operation voltage of 30 V, the above photoconductive layer was 40% higher in sensitivity for blue light than a similar layer made of amorphous silicon free from boron, and the lag of the former was not more than one-third of that of the latter.

Figure 6:
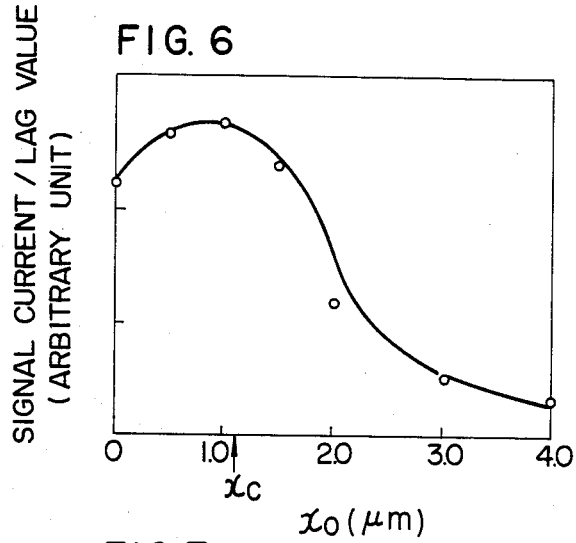
FIG. 6 is a graph showing a relation between a point $x_o$ at which the boron doping is started, and the product of a signal current and the reciprocal of a lag value.

Several photoconductive films different from each other in a distance $x_o$ (that is, the depth at which the boron doping was started) were fabricated by the use of the same sputtering instrument, and were used in different imaging tubes. Characteristics of each imaging tube for signal light having a wavelength of 550 nm (that is, blue light) were measured. The results of measurements are shown in FIG. 6. In FIG. 6, the product of a signal output and the reciprocal of a lag value (namely, a ratio of a residual current obtained when 50 ms has elapsed after incident light was removed, to a current before the removal is used as an index of the performance of imaging tube, and is shown in an arbitrary unit. Further, in FIG. 6, the distance $x_c$ of the photoconductive films is shown for reference, and a circle corresponding to $x_o = 4.0$ μm indicates the characteristic of an imaging device whose photoconductive film is made of amorphous silicon free from boron. The distance $x_o$ may deviate from the distance $x_c$ in some degree, from the practical point of view. However, when the distance $x_o$ exceeds a distance $x_c + 0.5$ μm, the lag characteristics of imaging tube are degraded in considerable degree.

That is, in the case where the distribution of boron content has a form of a rectangle, it is important that the boron doping is started at a position corresponding to the distance $x_c$ as shown in FIG. 5.

Further, when the concentration of boron in a photoconductive layer is increased up to 100 ppm, the resistance of the layer is decreased to the extent that an imaging tube provided with the photoconductive layer cannot be used. That is, the upper limit of the doping level is 100 ppm. Further, the lower limit of the doping level is 1 ppm (preferably, 5 ppm).

Figure 7:
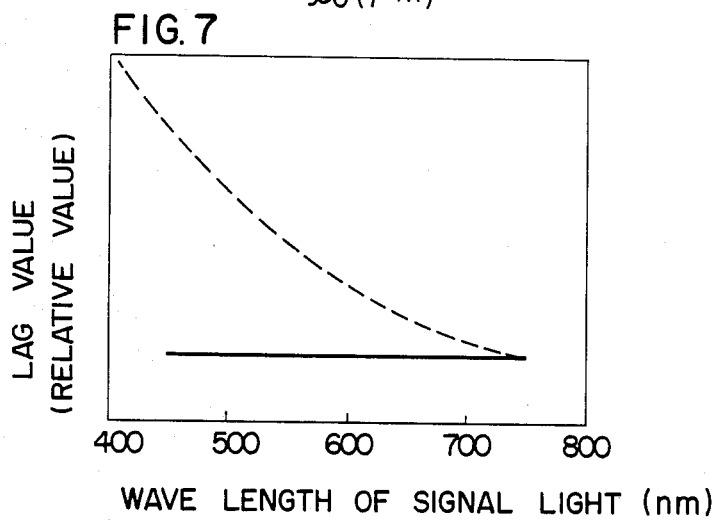
FIG. 7 is a graph showing the variation of the lag value of image pickup tube with the frequency of signal light.

The lag characteristics of an image pickup tube fabricated in the manner described in the Embodiment 1 are indicated by a solid line in FIG. 7. Further, in FIG. 7, the lag characteristics of an image pickup tube which includes a photoconductive layer made of conventional amorphous silicon, are indicated by a broken line, for the purpose of comparison. It is known from FIG. 7 that the lag characteristics on the short-wavelength side are greatly improved by the present invention.

Figure 8:
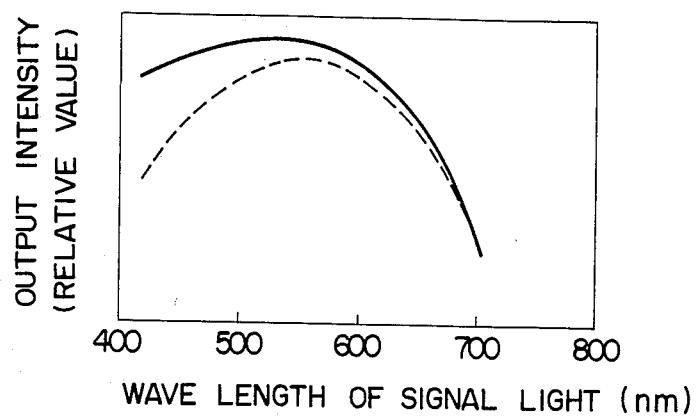
FIG. 8 is a graph showing the variation of the photosensitivity of image pickup tube with the frequency of signal light.

FIG. 8 shows the spectral photosensitivity of each of the above-mentioned image pickup tubes. In FIG. 8, a solid line indicates the photosensitivity characteristics of the image pickup tube according to the present invention, and a broken line indicates those of the conventional image pickup tube. As is apparent from FIG. 8, the photosensitivity characteristics of image pickup tube are also improved by the present invention.

Further, the concentration of boron in the photoconductive layer of the Embodiment 1 is made low at the interface between the transparent electrode and photoconductive layer, and therefore the dark current is reduced. This has been confirmed by measurements.

EMBODIMENT 2

Figure 9:
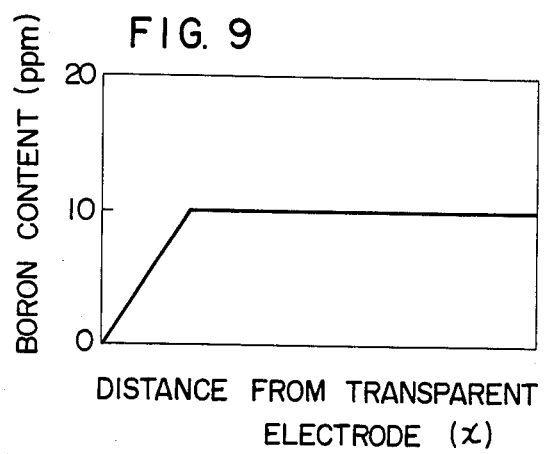
FIGS. 9 and 10 are graphs showing the distribution of boron content in two different embodiments of a photoconductive layer according to the present invention.

A sputtering instrument having a plurality of gas inlets is used, and amorphous silicon is deposited on a substrate under the same discharge conditions as in the Embodiment 1, while using a high-purity silicon source. When the deposition of amorphous silicon is performed, diborane $B_2H_6$ is introduced into a belljar in such a manner that the flow rate of diborane is continuously increased. As soon as the boron content of deposited amorphous silicon becomes equal to 10 ppm, the flow rate of diborane is prevented from increasing, and thereafter the flow rate is kept constant. In the above-mentioned manner, amorphous silicon is deposited to a thickness of 5 μm. In an amorphous silicon layer thus deposited, the distribution of boron concentration has a form shown in FIG. 9. In such a distribution, the concentration of boron on the transparent-electrode side is small, and therefore the boron doping is started at the interface between a transparent electrode and the amorphous silicon layer. However, it is desirable that the doping level at the distance $x_c$ is less than 10 ppm (preferably, less than 5 ppm).

An image pickup tube including the above amorphous silicon layer as a photoconductive layer showed the same excellent characteristics as the image pickup tube including the photoconductive layer of the Embodiment 1.

EMBODIMENT 3

Figure 10:
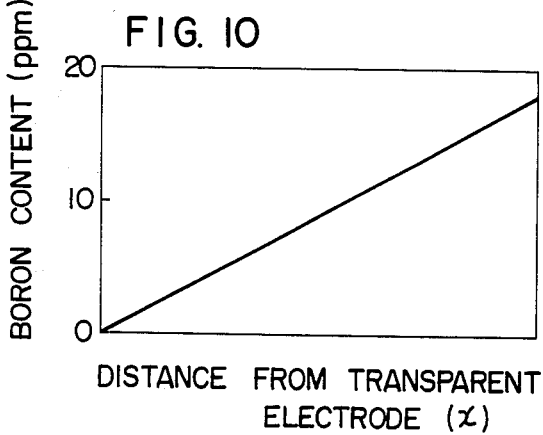

An amorphous silicon layer doped with boron is deposited in the same manner as in the Embodiment 1. In this case, however, the concentration of boron is continuously increased during the amorphous silicon layer is deposited. The distribution of boron concentration in the amorphous silicon layer has such a form as shown in FIG. 10.

As described previously, it is required that the concentration of boron is low in a region of the amorphous silicon layer having a depth of $x_c$ from the light receiving surface thereof. That is, the concentration of boron in this region is made not more than 10 ppm, preferably not more than 5 ppm. An amorphous silicon layer having a thickness of 4 μm and a maximum boron concentration of 50 ppm was formed. This layer was excellent in characteristics for blue light to the same extent as the amorphous silicon layer of the Embodiment 1.

Elements belonging to the group III such as aluminum, gallium and indium and elements belonging to the group II such as zinc and cadmium can exhibit the same effect as boron. These elements can be added to silicon by the use of the sputtering instrument described in the Embodiment 1. When each of these elements is added to silicon, the concentration of the element can be readily adjusted in such a manner that part of the surface of a silicon source is coated with the element and the coating area is varied in accordance with a desired concentration. Further, each of the above elements can be added to silicon by the method described in the Embodiment 2, that is, by introducing a gas containing a compound of the element into the sputtering instrument. In this case, however, the behavior of each of the elements is not studied so fully as that of boron, and therefore the control of impurity concentration in silicon is not so simple as the abovementioned method which uses a silicon source coated with the impurity.

The preferred concentration of each of these elements is equal to that of boron. Even when two or more of these elements and boron are added to silicon, the same effect as the addition of one element to silicon is obtained.

As has been explained in the foregoing, according to the present invention, since the dopant concentration in a photoconductive layer is made low on the transparent-electrode side thereof, not only the most excellent characteristics are obtained for all wavelengths of incident signal light but also the dark current can be suppressed. Thus, an image pickup tube whose photoconductive layer is made of amorphous silicon can be used in a wide technical field.

In the embodiments 1, 2 and 3, the deposition of amorphous silicon layer through the reactive sputtering method has been explained. However, an amorphous silicon layer made by the glow discharge decomposition method or the like can produce the same effect as the above-mentioned layer. Further, even in the case where a blocking layer made of one of various oxides and fluorides or highly-doped amorphous silicon of n-type conductivity is interposed between a transparent electrode and a photoconductive layer as usual to suppress the dark current of image pickup tube, if the photoconductive layer is a photoconductive layer according to the present invention, the same effect as the case where the blocking layer is omitted, is obtained.

Further, it is needless to say that a photoconductive layer (that is, a photosensing layer) according to the present invention is also applicable to photoelectric conversion devices other than an image pickup tube, that is, a solid-stage imaging device and others.

We claim:

1. A photosensor comprising:
a transparent electrode disposed on a light receiving side of said photosensor and formed of a transparent conductive film; and
a photoconductive layer disposed on said transparent electrode, said photoconductive layer consisting of at least 5 to 30 atomic percent of hydrogen, at least one doped impurity selected from the group consisting of elements belonging to Groups II and III of the Periodic Table and the balance of amorphous silicon, a voltage being applied across said photoconductive layer so that a surface of said photoconductive layer facing said transparent electrode is at a positive potential with respect to another surface of said photoconductive layer opposite to said surface facing said transparent electrode; said at least one impurity having a concentration profile which is in a range of 0 to 5 ppm at the interface between said transparent electrode and said photoconductive layer, which does not decrease with the distance from the interface, and which is in a range of 1 to 100 ppm at said another surface of the photoconductive layer.

2. A photosensor according to claim 1, wherein the concentration of said selected element in said photoconductive layer is not more than 5 ppm at the interface between said transparent conductive film and said photoconductive layer, is equal to zero or increases with the distance from the interface in a region of the photoconductive layer between the interface and a middle area of the photoconductive layer and lies in a range from 1 to 100 ppm in a region between the middle area of said photoconductive layer and said another surface of said photoconductive layer opposite to said surface facing said transparent electrode.

3. A photosensor according to claim 2, wherein the concentration of said selected element in said photoconductive layer is not more than 10 ppm in a region between said interface and an area which is away from said interface by a distance of 0.5 μm.

4. A photosensor according to claim 1, wherein the concentration of said selected element in said photoconductive layer is not more than 10 ppm within a region between said interface and an area which is away by a distance $x_c$ from said interface, at said area hole current density $J_p$ being equal to an electron current density $J_e$, and lies in a range from 1 to 100 ppm in another region between said area which is away by said distance $x_c$ from said interface and said another surface of said photoconductive layer.

5. A photosensor according to claim 1, wherein a beam landing layer is provided on said another surface of said photoconductive layer, and the intensity distribution of incident light at said transparent conductive film is detected by scanning said beam landing layer with an electron beam.

6. A photosensor according to claim 1, wherein said elements belonging to the group II comprise zinc and cadmium, and said elements belonging to the group III comprise boron, aluminum, gallium and indium.

7. A photosensor according to claim 1, wherein said at least one impurity has a concentration profile which has a higher value in a region remote from the transparent electrode than the concentration in a region proximate to the transparent electrode.

8. An image pickup tube comprising:
a transparent substrate for receiving an optical image through the substrate;
a transparent electrode formed on a surface of said transparent substrate and made of an optically transparent and electrically conductive material;
a photoconductive layer disposed on said transparent electrode, said photoconductive layer consisting of at least 5 to 30 atomic percent hydrogen, at least one doped impurity selected from the group consisting of elements belonging to Groups II and III of the Periodic Table and the balance of amorphous silicon, a voltage being applied across said photoconductive layer so that a surface of said photoconductive layer facing said transparent electrode is at a positive potential with respect to another surface of said photoconductive layer opposite to said surface facing said transparent electrode, said at least one impurity having a concentration profile which is in a range of 0 to 5 ppm at the interface between said transparent electrode and said photoconductive layer, which does not decrease with the distance from the interface, and which is in a range of 1 to 100 ppm at said another surface of the photoconductive layer;
an electron gun for emitting an electron beam toward said photoconductive layer;
an electron deflector disposed between said photoconductive layer and said electron gun for deflecting said electron beam so as to scan a surface of said photoconductive layer with said electron beam; and
a power source connected between said transparent electrode and said electron gun.

9. An image pickup tube according to claim 8, wherein the concentration of said selected element in said photoconductive layer is not more than 5 ppm at the interface between said transparent electrode and said photoconductive layer, is equal to zero or increases with the distance from the interface in a region of the photoconductive layer between the interface and a middle area of the photoconductive layer and lies in arange from 1 to 100 ppm in a region between the middle area of said photoconductive layer said said another surface of said photoconductive layer opposite to said surface facing said transparent electrode.

10. A image pickup tube according to claim 9, wherein the concentration of said selected element in said photoconductive layer is not more than 10 ppm in a region between said interface and an area which is away from said interface by a distance of 0.5 μm.

11. An image pickup tube according to claim 8, wherein the concentration of said selected element in said photoconductive layer is not more than 10 ppm without a region between said interface and an area which is away by a distance $x_c$ from said interface, at said area hole current density $J_p$ being equal to an electron current density $J_e$, and lies in a range from 1 to 100 ppm in another region between said area which is away by said distance $x_c$ from said interface and said another surface of said photoconductive layer.

12. An image pickup tube according to claim 8, wherein at least one of a thin semiconductor layer of n-type conductivity and a thin transparent dielectric layer is interposed between said photoconductive layer and said transparent conductive electrode.

13. An image pickup tube according to claim 8, wherein a beam landing layer is provided on said another surface of said photoconductive layer, and the intensity distribution of incident light at said transparent electrode is detected by scanning said beam landing layer with an electron beam.

14. An image pickup tube according to claim 8, wherein said elements belonging to the group II comprise zinc and cadmium, and said elements belonging to the group III comprise boron, aluminum, gallium and indium.

15. An image pickup tube according to claim 8, wherein said at least one impurity has a concentration profile which has a higher value in a region remote from the transparent electrode than the concentration in a region proximate to the transparent electrode.

* * * * *